United States Patent
Sun et al.

(10) Patent No.: US 11,316,137 B2
(45) Date of Patent: Apr. 26, 2022

(54) FLEXIBLE DISPLAY PANEL, METHOD FOR FABRICATING THE SAME AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Kuo Sun, Beijing (CN); Lujiang Huangfu, Beijing (CN); Meng Zhao, Beijing (CN); Guoqiang Tang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 404 days.

(21) Appl. No.: 16/480,023

(22) PCT Filed: Sep. 13, 2018

(86) PCT No.: PCT/CN2018/105501
§ 371 (c)(1),
(2) Date: Jul. 23, 2019

(87) PCT Pub. No.: WO2019/148853
PCT Pub. Date: Aug. 8, 2019

(65) Prior Publication Data
US 2021/0359282 A1    Nov. 18, 2021

(30) Foreign Application Priority Data

Feb. 2, 2018 (CN) .......................... 201810106226.8

(51) Int. Cl.
*H01L 51/56* (2006.01)
*H01L 51/00* (2006.01)
(Continued)

(52) U.S. Cl.
CPC .......... *H01L 51/56* (2013.01); *H01L 51/0097* (2013.01); *H01L 51/5253* (2013.01);
(Continued)

(58) Field of Classification Search
None
See application file for complete search history.

(56) References Cited

U.S. PATENT DOCUMENTS

2016/0190389 A1* 6/2016 Lee .................... H01L 27/1255
257/93
2017/0003800 A1    1/2017 Zhu
(Continued)

FOREIGN PATENT DOCUMENTS

CN    104851903 A    8/2015
CN    105655504 A    6/2016
(Continued)

OTHER PUBLICATIONS

Office Action for corresponding Chinese application 201810106226.8 dated Apr. 20, 2020.

*Primary Examiner* — J. E. Schoenholtz
(74) *Attorney, Agent, or Firm* — Arent Fox LLP; Michael Fainberg (57) ABSTRACT

A flexible display panel, a method for fabricating the same, and a display device are provided. A protruding structure located is formed in a via-hole area on a flexible base substrate so that both the protruding structure, and the portions of an organic light-emitting functional film and a top electrode layer covering the protruding structure can be removed. Thereafter an encapsulation thin film covering the patterns of the organic light-emitting functional film and the top electrode layer is formed. After the encapsulation thin film is formed, the step of removing the pattern of the encapsulation thin film in the via-hole area can be further performed to expose the flexible base substrate in the (Continued)

via-hole area, and after the flexible base substrate in the via-hole area is removed, a via-hole can be formed in the flexible base substrate.

9 Claims, 8 Drawing Sheets

(51) Int. Cl.
  *H01L 51/52* (2006.01)
  *H01L 27/32* (2006.01)
(52) U.S. Cl.
  CPC ...... *H01L 51/5256* (2013.01); *H01L 27/3244* (2013.01); *H01L 27/3281* (2013.01); *H01L 2251/5338* (2013.01)

(56) References Cited

U.S. PATENT DOCUMENTS

2018/0183015 A1* 6/2018 Yun .................... H01L 51/0097
2019/0109295 A1   4/2019 Tang et al.

FOREIGN PATENT DOCUMENTS

| CN | 105742321 A | 7/2016 |
| CN | 105845712 A | 8/2016 |
| CN | 106601775 A | 4/2017 |
| CN | 107331694 A | 11/2017 |
| CN | 107452894 A | 12/2017 |
| CN | 108321176 A | 7/2018 |

* cited by examiner

FLEXIBLE DISPLAY PANEL, METHOD FOR FABRICATING THE SAME AND DISPLAY DEVICE

This application is a US National Stage of International Application No. PCT/CN2018/105501, filed Sep. 13, 2018, which claims priority to Chinese Patent Application No. 201810106226.8, filed with the Chinese Patent Office on Feb. 2, 2018, and entitled "Flexible display panel, Method for fabricating the same, and Display device", which is hereby incorporated by reference in its entirety.

FIELD

This disclosure relates to the field of display technologies, and particularly to a flexible display panel, a method for fabricating the same, and a display device.

BACKGROUND

With the development of the display technologies, an all-screen display panel with a high screen-to-body ratio and an ultra-narrow bezel can greatly improve a visual effect for a viewer as compared with a general display panel, and thus has been widely favored. At present, in order to perform self-photographing, video communication, and fingerprint recognition functions in a display device including an all-screen display panel, e.g., a phone, etc., a front camera, an earphone, a fingerprint recognizing element, a physical button, etc., are typically arranged in a display area.

At present, in order to provide the flexibility of a flexible display panel, the flexible display panel is generally fabricated using an organic light-emitting diode display panel. In order to provide the all-screen flexible display panel, a via-hole is arranged in a display area of the flexible display panel, where the via-hole is a hole running through the flexible display panel in the thickness direction thereof so that a front camera, an earphone, a fingerprint recognizing element, a physical button, etc., are arranged in the via-hole. However during the fabricating of the flexible display panel, it is not possible to arrange a suspended component for shielding a via-hole area, in an open mask for forming an organic light-emitting functional film in the organic light-emitting diode display panel.

Accordingly it is highly desirable in the art to arrange a via-hole in the display area of the flexible display panel.

SUMMARY

In view of this, embodiments of this disclosure provide a flexible display panel, a method for fabricating the same, and a display device in the following solutions.

An embodiment of this disclosure provides a method for fabricating a flexible display panel. The method includes: forming a protruding structure in a via-hole area on a flexible base substrate, wherein the via-hole area is in a display area of the flexible base substrate; forming an organic light-emitting functional film and a top electrode layer successively on the flexible base substrate formed with the protruding structure; removing the protruding structure and portions of the organic light-emitting functional film and the top electrode layer covering the protruding structure, to form patterns of the organic light-emitting functional film and the top electrode layer; forming an encapsulation thin film covering the patterns of the organic light-emitting functional film and the top electrode layer on the flexible base substrate; removing a portion of the encapsulation thin film in the via-hole area; and removing a portion of the flexible base substrate in the via-hole area.

In some embodiments, in the fabricating method above, an area of a cross section of the protruding structure increases gradually along a direction from the flexible base substrate pointing to away from the flexible base substrate, the cross section being parallel to the flexible base substrate.

In some embodiments, in the fabricating method above, the forming the protruding structure in the via-hole area on the flexible base substrate includes: forming a negative photo-resist layer on the flexible base substrate; and patterning the negative photo-resist layer to form the protruding structure.

In some embodiments, in the fabricating method above, the removing the protruding structure and the portions of the organic light-emitting functional film and the top electrode layer covering the protruding structure, to form the patterns of the organic light-emitting functional film and the top electrode layer includes: stripping away the protruding structure using stripping liquid, and removing the portions of the organic light-emitting functional film and the top electrode layer covering the protruding structure, to form the patterns of the organic light-emitting functional film and the top electrode layer.

In some embodiments, in the fabricating method above, forming the encapsulation thin film includes: forming a plurality of layers of inorganic thin films and at least one layer of organic thin film, the plurality of layers of inorganic thin films and at least one layer of organic thin film being arranged alternately; and forming the organic thin film of the encapsulation thin film includes: forming the organic thin film in the other area than the via-hole area through inkjet printing.

In some embodiments, in the fabricating method above, the forming the organic thin film in the other area than the via-hole area through inkjet printing includes: forming a pattern of the organic thin film, which is the same as the patterns of the organic light-emitting functional film and the top electrode layer, through inkjet printing.

In some embodiments, in the fabricating method above, the removing the portion of the flexible base substrate in the via-hole area includes: removing the portion of the flexible base substrate in the via-hole area using laser.

In some embodiments, in the fabricating method above, before forming the protruding structure in the via-hole area on the flexible base substrate, the method further includes: forming a pixel circuit structure layer on the flexible base substrate, wherein the pixel circuit structure layer has a hollow area in the via-hole area.

In some embodiments, in the fabricating method above, forming the organic light-emitting functional film includes: forming a hole injection layer, an electron blocking layer, an organic light-emitting layer, a hole blocking layer, and an electron injection layer.

In another aspect, an embodiment of this disclosure further provides a flexible display panel fabricated in the fabricating method above. The flexible display panel includes: the flexible base substrate having the via-hole area; the organic light-emitting functional film and the top electrode layer successively on the flexible base substrate, wherein patterns of the organic light-emitting functional film and the top electrode layer being only in other area than the via-hole area; and the encapsulation thin film covering the organic light-emitting functional film and the top electrode layer, wherein a pattern of the encapsulation thin film being only in the other area than the via-hole area.

In some embodiments, in the flexible display panel above, the flexible display panel further includes: a pixel circuit structure layer between the flexible base substrate and the organic light-emitting functional film; and a pattern of the pixel circuit structure layer being only in the other area than the via-hole area.

In some embodiments, in the flexible display panel above, the encapsulating thin film includes: a plurality of layers of inorganic thin films and at least one layer of organic thin film, the plurality of layers inorganic thin films and the at least one layer of organic thin film being alternate.

In some embodiments, in the flexible display panel above, the organic light-emitting functional film includes: a hole injection layer, an electron blocking layer, an organic light-emitting layer, a hole blocking layer, and an electron injection layer.

In another aspect, an embodiment of this disclosure further provides a display device including the flexible display panel above according to the embodiment of this disclosure.

In some embodiments, in the display device above, the flexible display panel further includes: a pixel circuit structure layer between the flexible base substrate and the organic light-emitting functional film; and a pattern of the pixel circuit structure layer being only in the other area than the via-hole area.

In some embodiments, in the display device, the encapsulating thin film includes: a plurality of layers of inorganic thin films and at least one layer of organic thin film, the plurality of layers inorganic thin films and the at least one layer of organic thin film being alternate.

In some embodiments, the display device further includes: a component in the via-hole of the flexible display panel.

In some embodiments, in the display device, the component is a front camera, an earphone, a fingerprint recognizing element, or a physical.

DETAILED DESCRIPTION

In order to make the objects, technical solutions, and advantages of this disclosure more apparent, this disclosure will be described below in further details with reference to the drawings. Apparently the embodiments to be described are only a part but not all of the embodiments of this disclosure. Based upon the embodiments here of this disclosure, all the other embodiments which can occur to those ordinarily skilled in the art without any inventive effort shall come into the scope of this disclosure as claimed.

The shapes and sizes of various components in the drawings are not intended to reflect any real proportion, but only intended to illustrate this disclosure.

Figure 1:
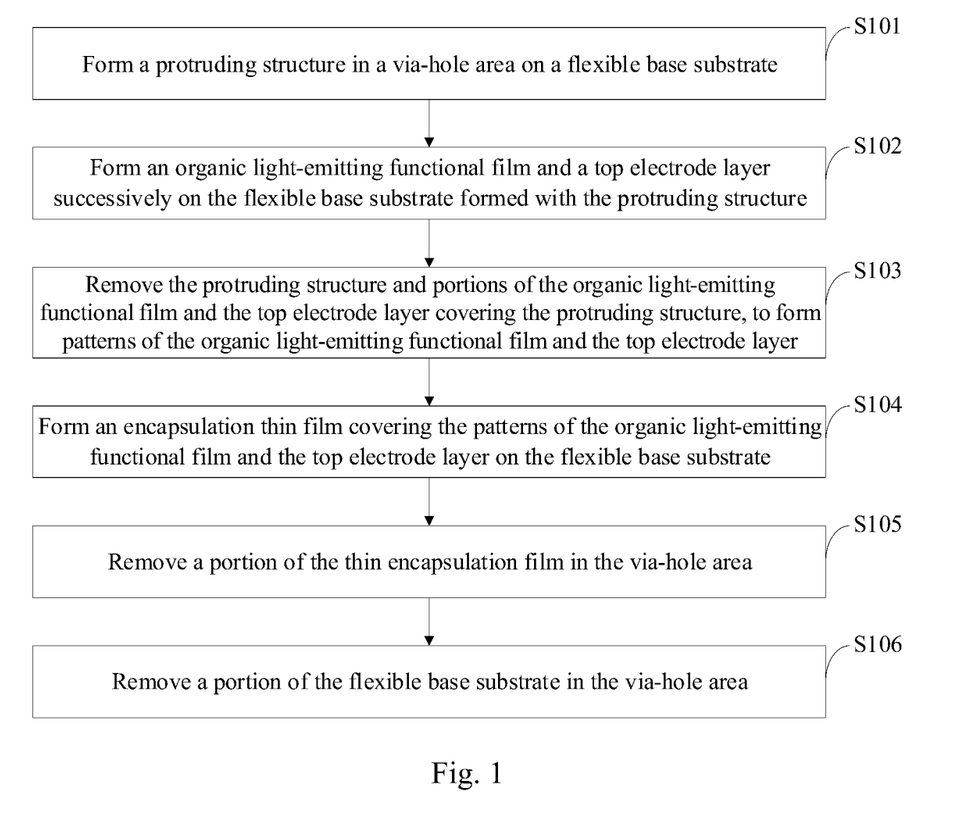
FIG. 1 is a schematic flow chart of a method for fabricating a flexible display panel according to an embodiment of this disclosure.

As illustrated in FIG. 1, a method for fabricating a flexible display panel according to an embodiment of this disclosure includes the following steps.

The step S101 is to form a protruding structure in a via-hole area on a flexible base substrate.

Where the via-hole area is located in a display area of the flexible base substrate.

The step S102 is to form an organic light-emitting functional film and a top electrode layer successively on the flexible base substrate formed with the protruding structure.

The step S103 is to remove the protruding structure and the portions of the organic light-emitting functional film and the top electrode layer covering the protruding structure, to form patterns of the organic light-emitting functional film and the top electrode layer.

The step S104 is to form an encapsulation thin film covering the patterns of the organic light-emitting functional film and the top electrode layer on the flexible base substrate.

The step S105 is to remove a portion of the encapsulation thin film in the via-hole area.

The step S106 is to remove a portion of the flexible base substrate in the via-hole area.

Specifically in the fabricating method above according to the embodiment of this disclosure, the protruding structure is formed in the via-hole area on the flexible base substrate so that both the protruding structure and the portions of the organic light-emitting functional film and the top electrode layer covering the protruding structure can be removed instead of arranging a suspended component for shielding the via-hole area, in an open mask, so that there are no patterns of the organic light-emitting functional film and the top electrode layer in the via-hole area. Thereafter the encapsulation thin film covering the patterns of the organic light-emitting functional film and the top electrode layer is formed to encapsulate the organic light-emitting functional film in the via-hole area to thereby seal the flexible display panel in the via-hole area, so as to prevent display elements from failing. After the encapsulation thin film is formed, the step of removing the pattern of the encapsulation thin film in the via-hole area can be further performed to expose the flexible base substrate in the via-hole area, and after the flexible base substrate in the via-hole area is removed, a via-hole can be formed in the flexible base substrate.

Optionally in the fabricating method above according to the embodiment of this disclosure, before the protruding structure is formed in the via-hole area on the flexible base substrate in the step S101, the method can further include the following step: forming a pixel circuit structure layer on the flexible base substrate, where the pixel circuit structure layer has a hollow area in the via-hole area.

Specifically the pixel circuit structure layer is formed on the flexible base substrate to control the organic light-emitting functional film to emit light, where the pixel circuit structure layer generally includes a metal layer, a semiconductor layer, an insulation layer, and other inorganic films, and these inorganic films can be patterned to form a control circuit for controlling pixels to emit light, where the structure of the control circuit has a number of implementations, and a detailed description thereof will be omitted here. Furthermore in order to avoid the insulation layer in the pixel circuit structure layer from interfering with a process of subsequently removing the flexible base substrate in the via-hole area, there is generally no pattern of the pixel circuit structure layer in the via-hole area, and specifically the patterns of the various films of the pixel circuit structure layer in the via-hole area can be removed in a patterning process of forming the various films.

Optionally in the fabricating method above according to the embodiment of this disclosure, the organic light-emitting functional film formed in the step S102 generally can include a hole injection layer, an electron blocking layer, an organic light-emitting layer, a hole blocking layer, an electron injection layer, and other films, all of which are made of an organic material. It is generally formed using a Fine Metal Mask (FMM). The top electrode layer is generally arranged as a whole, and formed using an open mask. Specifically the top electrode layer can correspond to a cathode in the upright type organic light-emitting diode display panel, which including an anode, the organic light-emitting functional film, and the cathode successively stacked on the flexible base substrate, or the top electrode layer can correspond to an anode in the inverted organic light-emitting diode display panel, which includes a cathode, the organic light-emitting functional film, and the anode successively stacked on the flexible base substrate, although the embodiment of this disclosure will not be limited thereto.

Optionally in the fabricating method above according to the embodiment of this disclosure, a cross section of the protruding structure, located in the via-hole area, formed on the flexible base substrate in the step S101 generally increases gradually along the direction from the flexible base substrate pointing to away from the flexible base substrate.

Specifically the formed protruding structure is an inverted trapezoidal structure with a smaller bottom and a larger top, so that when the organic light-emitting functional film and the top electrode layer are subsequently formed in the step S102, the organic light-emitting functional film and the top electrode layer which are arranged respectively as an integral whole are broken at the edge of the protruding structure, that is, the areas of the organic light-emitting functional film and the top electrode layer covering the protruding structure are broken from the other areas thereof.

Specifically in the fabricating method above according to the embodiment of this disclosure, the shape of the formed protruding structure (herein, the shape of the formed protruding structure refers to the shape of the longitudinal cross section of the formed protruding structure perpendicular to the base substrate) will not be limited to the inverted trapezoidal structure above, but the protruding structure can be a normal trapezoidal structure with a larger bottom and a smaller top, or a rectangular structure with a uniform area of cross section, the cross section being parallel to the base substrate, and in this way, the difference between the thickness of the protruding structure and the thicknesses of the organic light-emitting functional film and the top electrode layer can be increased, so that the areas of the organic light-emitting functional film and the top electrode layer covering the protruding structure are broken from the other areas thereof.

Optionally in the fabricating method above according to the embodiment of this disclosure, the protruding structure can be formed in the via-hole area on the flexible base substrate in the step S101 specifically as follows: firstly a negative photo-resist layer is formed on the flexible base substrate; and then the negative photo-resist layer is patterned to form the protruding structure.

Specifically the negative photo-resist layer can be patterned by shielding the other area than the via-hole area using a mask in a preset pattern so that the negative photo-resist layer in the other area than the via-hole area is dissolved, and the negative photo-resist layer in the via-hole area is reserved; and the protruding structure formed of the negative photo-resist layer can be an inverted trapezoidal structure due to the characteristic of the negative photo-resist layer.

Optionally in the fabricating method above according to the embodiment of this disclosure, the protruding structure, and the portions of the organic light-emitting functional film and the top electrode layer covering the protruding structure can be removed to form the patterns of the organic light-emitting functional film and the top electrode layer in step 103 specifically as follows: the protruding structure is stripped away using stripping liquid, but also the portions of the organic light-emitting functional film and the top electrode layer covering the protruding structure are removed, to form the patterns of the organic light-emitting functional film and the top electrode layer.

Specifically in the fabricating method above according to the embodiment of this disclosure, the entire flexible base substrate is soaked in the stripping liquid to strip away the protruding structure, and in the meanwhile, the exposed negative photo-resist layer flakes away, also the portions of the organic light-emitting functional film and the top electrode layer covering the protruding structure are stripped away, thus resulting in the patterns of the organic light-emitting functional film and the top electrode layer which are hollow in the via-hole area.

Optionally in the fabricating method above according to the embodiment of this disclosure, the encapsulation thin film formed in the step S104 includes a plurality of layers of inorganic thin films, and at least one layer of organic thin film, which are arranged alternately. Specifically the encapsulation thin film includes the inorganic thin films and the organic thin film, which are stacked alternately over each other to protect the organic light-emitting functional film from being affected by ambient humidity, oxygen, etc., where the inorganic thin films generally prevent humidity, oxygen, etc., from entering the organic light-emitting functional film, and the organic thin film makes the encapsulation thin film flexible. The inorganic thin films are generally located at the innermost and outermost layers of the encapsulation thin film, that is, the encapsulation thin film is formed by firstly forming a layer of inorganic thin film and lastly forming another layer of inorganic thin film. Of course, firstly a layer of organic thin film at the innermost layer and lastly another layer of organic thin film at the outermost layer can be formed, although the embodiment of this disclosure will not be limited thereto.

Optionally in the fabricating method above according to the embodiment of this disclosure, the inorganic thin films in the formed encapsulation thin film can be arranged respectively as an integral whole so that the organic light-emitting functional film and the top electrode layer are sealed between the first layer of inorganic thin film and the flexible base substrate.

Optionally in the fabricating method above according to the embodiment of this disclosure, the organic thin film in the encapsulation thin film can be formed specifically as follows: the organic thin film is formed in the other area than the via-hole area through inkjet printing.

Specifically a pattern of inkjet printing can be set to thereby avoid a pattern of the organic thin film from being sprayed and formed in the via-hole area.

Optionally in the fabricating method above according to the embodiment of this disclosure, forming the organic thin film in the other area than the via-hole area through inkjet printing can specifically include: forming the pattern of the organic thin film, which is the same as the patterns of the organic light-emitting functional film and the top electrode layer, through inkjet printing.

Specifically the pattern of the organic thin film is the same as the patterns of the organic light-emitting functional film and the top electrode layer so that after the portion of the encapsulation thin film in the via-hole area is subsequently removed in the step S105, the organic thin film cannot be exposed in the via-hole area, that is, the organic thin film can be sealed by the upper inorganic thin film at the edge of the via-hole area so that the encapsulation thin film can be well sealed in the via-hole area.

Specifically in the fabricating method above according to the embodiment of this disclosure, removing the area of the flexible base substrate in the via-hole area in the step S106 can specifically include: removing the portion of the flexible base substrate in the via-hole area using laser.

A specific flow of the fabricating method above according to the embodiment of this disclosure will be described below in details in connection with a particular embodiment thereof.

Figure 2:
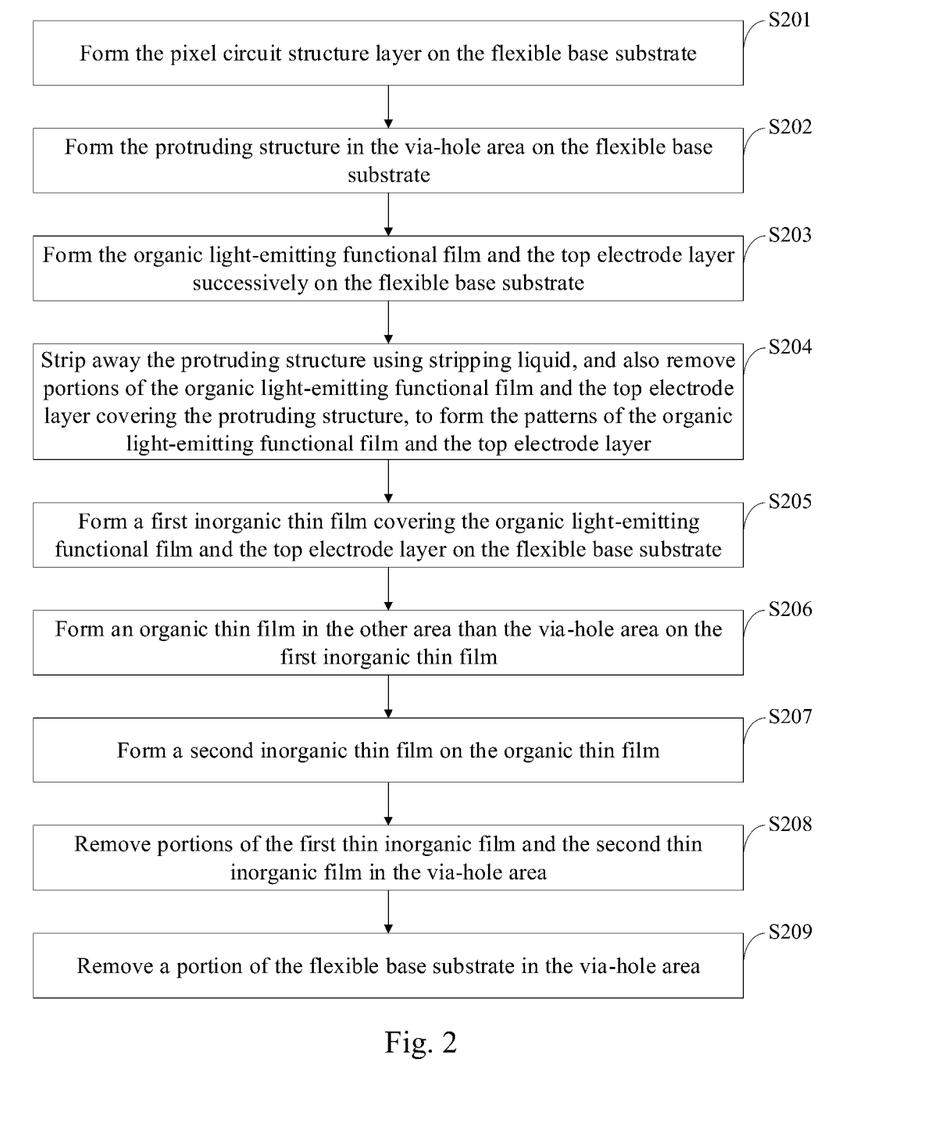
FIG. 2 is a schematic flow chart in details of the method for fabricating a flexible display panel according to the embodiment of this disclosure.

FIG. 2 illustrates a flow chart in details of the fabricating method above according to the embodiment of this disclosure, where the method specifically includes the following steps.

Figure 3A:
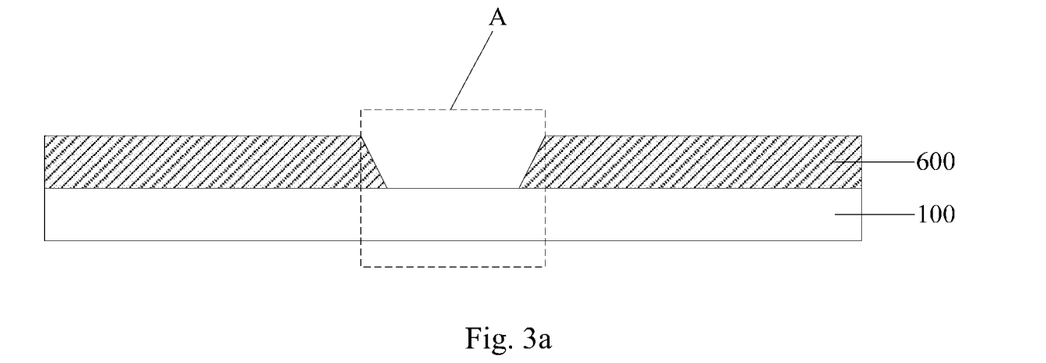
FIG. 3a to FIG. 3i are schematic structural diagrams after various steps in the method for fabricating a flexible display panel according to the embodiment of this disclosure are performed respectively.

The step S201 is to form the pixel circuit structure layer 600 on the flexible base substrate 100 as illustrated in FIG. 3a. In order to avoid the insulation layer in the pixel circuit structure layer 600 from interfering with a process of subsequently removing the flexible base substrate 100 in the via-hole area, there is generally no pattern of the pixel circuit structure layer 600 in the via-hole area A, that is, the pixel circuit structure layer has a hollow area in a via-hole area A.

Figure 3B:
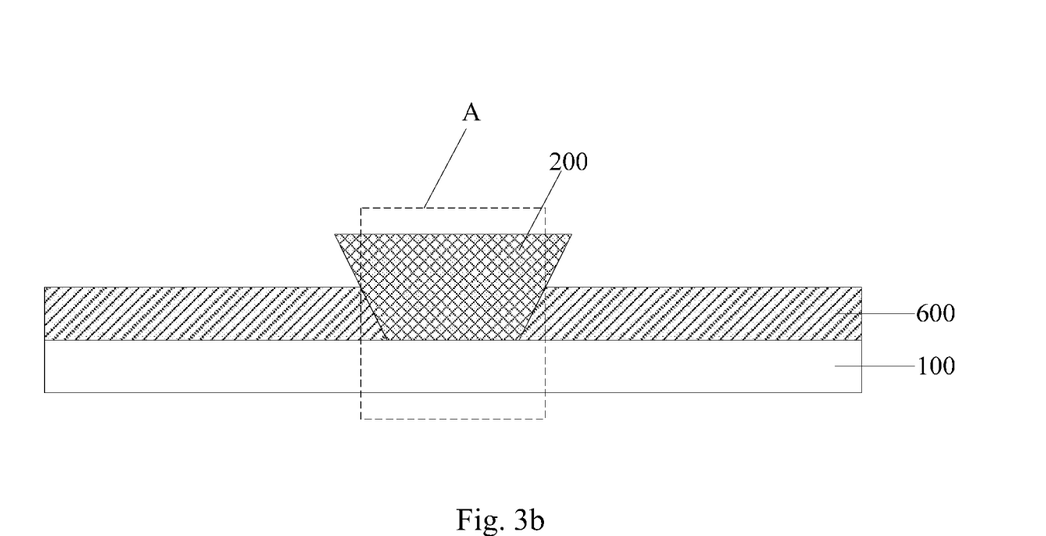

The step S202 is to form the protruding structure 200 in the via-hole area A on the flexible base substrate 100 as illustrated in FIG. 3b, where the protruding structure 200 having an inverted trapezoidal structure can be specifically formed using negative photo-resist.

Figure 3C:
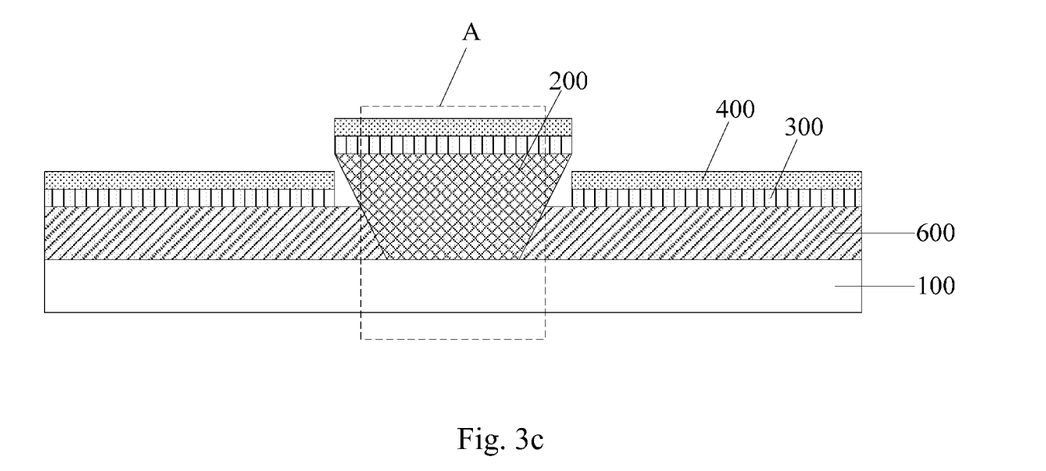

The step S203 is to form the organic light-emitting functional film 300 and the top electrode layer 400 successively on the flexible base substrate 100 as illustrated in FIG. 3c. Specifically the organic light-emitting functional film 300 is formed in the display area using a Fine Metal Mask (FMM), and thereafter the top electrode layer 400 arranged as a whole is formed on the organic light-emitting functional film 300 using an open mask; and the areas of the organic light-emitting functional film 300 and the top electrode layer 400 covering the protruding structure 200 are broken from the other areas thereof.

Figure 3D:
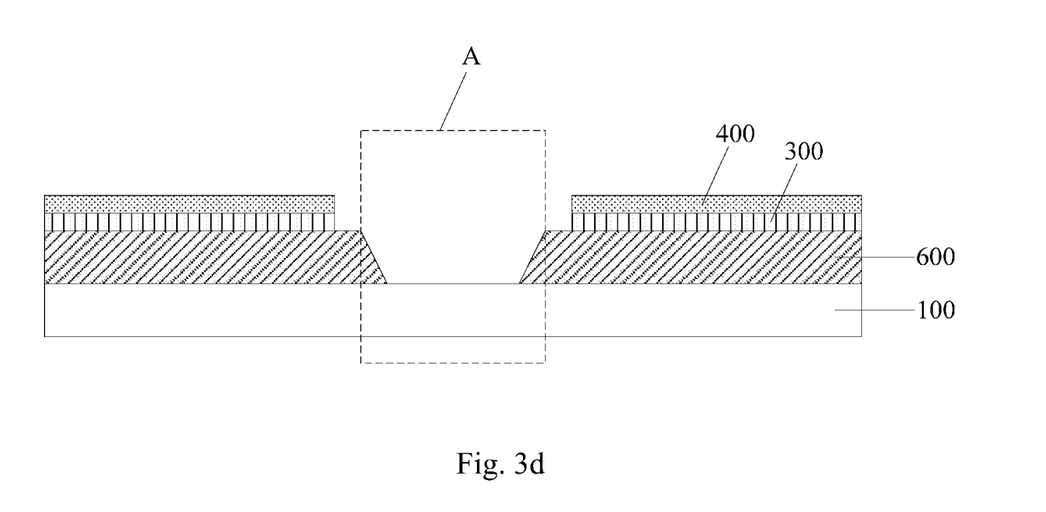

The step S204 is to strip away the protruding structure 200 using stripping liquid and also remove the portions of the organic light-emitting functional film 300 and the top electrode layer 400 covering the protruding structure 200, to form the patterns of the organic light-emitting functional film 300 and the top electrode layer 400, as illustrated in FIG. 3d.

Figure 3E:
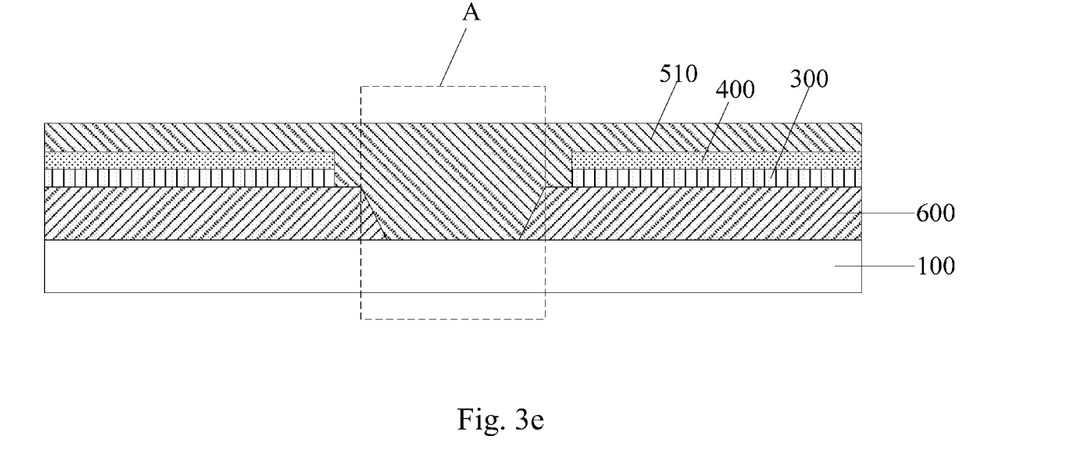

The step S205 is to form a first inorganic thin film 510 covering the organic light-emitting functional film 300 and the top electrode layer 400 on the flexible base substrate 100 as illustrated in FIG. 3e, where the first inorganic thin film 510 is arranged as a whole to seal the organic light-emitting functional film 300 and the top electrode layer 400 between the first inorganic thin film 510 and the flexible base substrate 100.

Figure 3F:
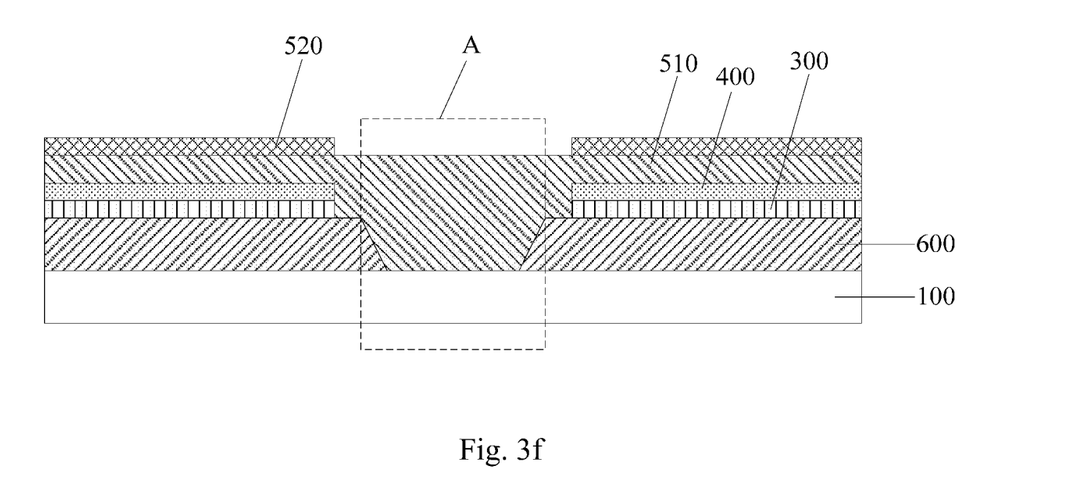

The step S206 is to form an organic thin film 520 in the other area than the via-hole area on the first inorganic thin film 510 as illustrated in FIG. 3f, where the organic thin film 520 can be formed through inkjet printing or otherwise, although the embodiment of this disclosure will not be limited thereto.

Figure 3G:
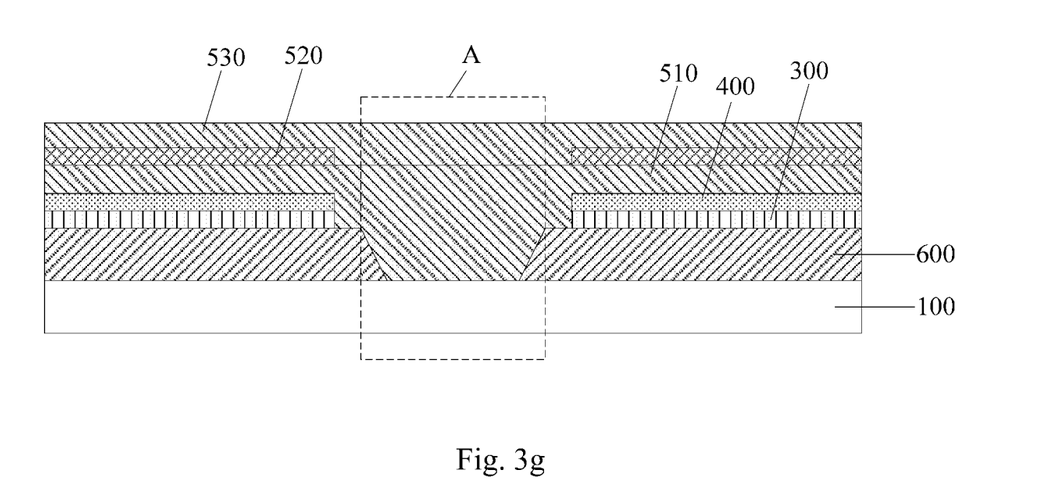

The step S207 is to form a second inorganic thin film 530 on the organic thin film 520 as illustrated in FIG. 3g, where the second inorganic thin film 530 arranged as a whole can seal the organic thin film 520 at the edge of the via-hole area A.

Figure 3H:
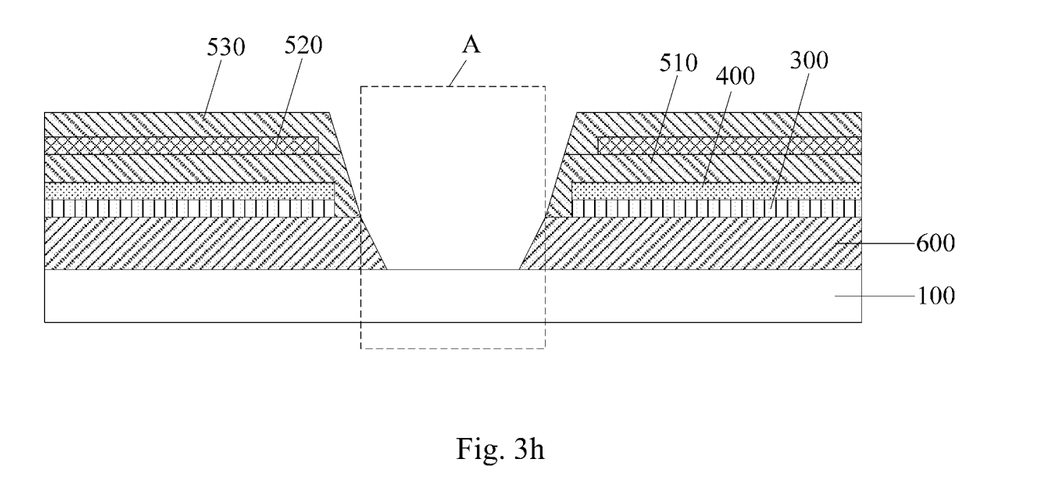

The step S208 is to remove the portions of the first inorganic thin film 510 and the second inorganic thin film 530 in the via-hole area A as illustrated in FIG. 3h, where the patterns of the first inorganic thin film 510 and the second inorganic thin film 530 in the via-hole area A can specifically be removed through etching.

Figure 3I:
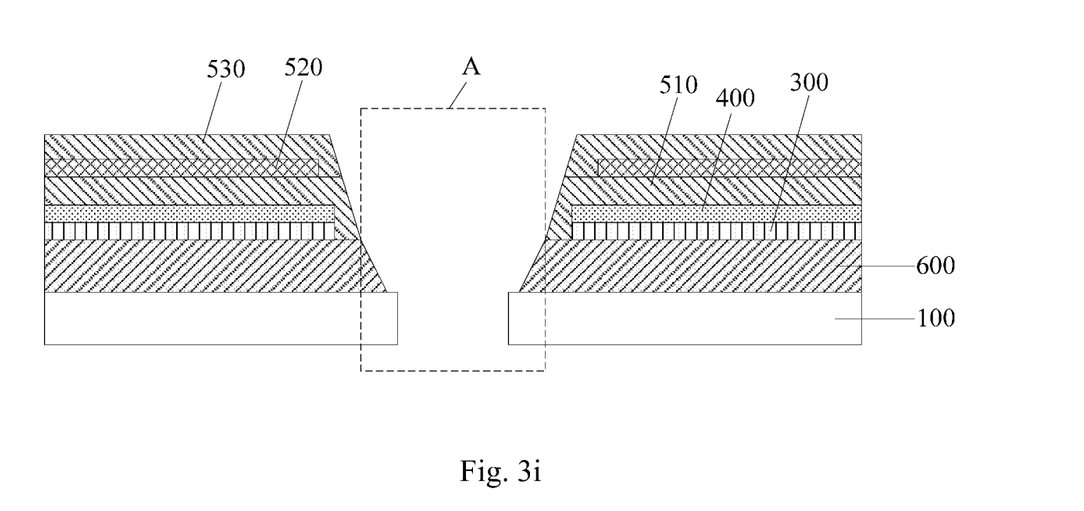

The step S209 is to remove a portion of the flexible base substrate 100 in the via-hole area A as illustrated in FIG. 3i, thus forming a via-hole running through the flexible base substrate 100 in the thickness direction thereof.

Based upon the same inventive idea, an embodiment of this disclosure further provides a flexible base substrate fabricated using the fabricating method above, and since the flexible base substrate addresses the problem under a similar principle to the fabricating method above, reference can be made to an implementation of the flexible base substrate above for an implementation of the fabricating method, and a repeated description thereof will be omitted here.

Figure 4:
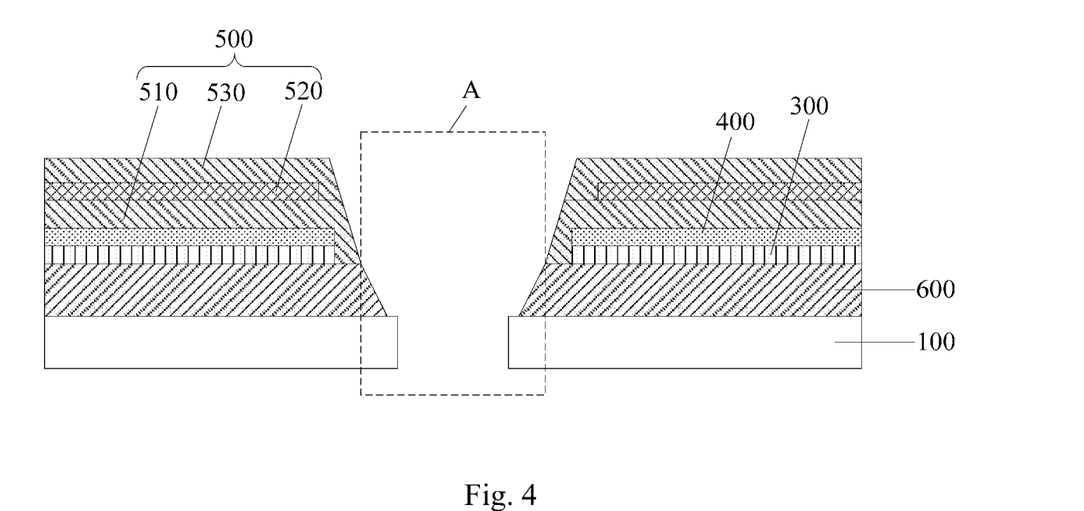
FIG. 4 is a schematic structural diagram of a flexible display panel according to an embodiment of this disclosure.

Specifically as illustrated in FIG. 4, an embodiment of this disclosure provides a flexible display panel. The flexible display panel includes: a flexible base substrate 100 having the via-hole area A; the organic light-emitting functional film 300 and the top electrode layer 400 located successively on the flexible base substrate 100, where the orthographic projection of the organic light-emitting functional film 300 and the orthographic projection of the top electrode layer 400 on the flexible base substrate 100 don't overlap with the via-hole area A (that is, the organic light-emitting functional film 300 and the top electrode layer 400 have hollow areas in the via-hole area A); and the encapsulation thin film 500 covering the organic light-emitting functional film 300 and the top electrode layer 400, where the pattern of the encapsulation thin film 500 is only in the other area than the via-hole area A.

Specifically in the flexible display panel above according to the embodiment of this disclosure, as illustrated in FIG. 4, the encapsulation thin film 500 can specifically include a plurality of layers of inorganic thin films 510 and 530, and at least one layer of organic thin film 520, which are arranged alternately. FIG. 4 illustrates the encapsulation thin film 500 including the first inorganic thin film 510, the organic thin film 520, and the second inorganic thin film 530 by way of an example, but the number of inorganic thin films, and the number of the organic thin films can be set as needed in a real application.

Optionally in the flexible display panel above according to the embodiment of this disclosure, as illustrated in FIG. 4, the flexible display panel can further include the pixel circuit structure layer 600 located between the flexible base substrate 100 and the organic light-emitting functional film 300, where the pixel circuit structure layer 600 is configured to control the organic light-emitting functional film 300 to emit light.

The pixel circuit structure layer 600 has a pattern only in the other area than the via-hole area A, that is, the pixel circuit structure layer 600 has a hollow area in the via-hole area A.

Figure 5:
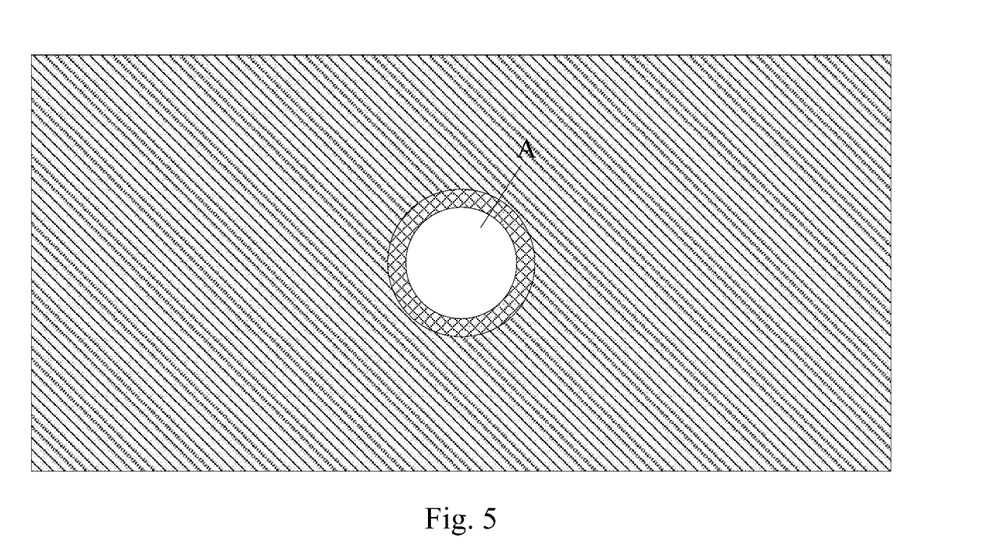
FIG. 5 is a schematic top view of the flexible display panel according to the embodiment of this disclosure in a top view.

Optionally in the flexible display panel above according to the embodiment of this disclosure, as illustrated in FIG. 5, the via-hole area A can be round, or can be another shape as needed for a physical component to be arranged in a display device, although the embodiment of this disclosure will not be limited thereto. Furthermore the via-hole area A can be located in the display area to achieve the all-screen display.

Based upon the same inventive idea, an embodiment of this disclosure further provides a display device including the flexible display panel above according to the embodiment of this disclosure. The display device can be a phone, a tablet computer, a TV set, a display, a notebook computer, a digital photo frame, a navigator, or any other product or component with a display function. Reference can be made to the embodiment of the flexible display panel above for an implementation of the display device, so a repeated description thereof will be omitted here.

Figure 6:
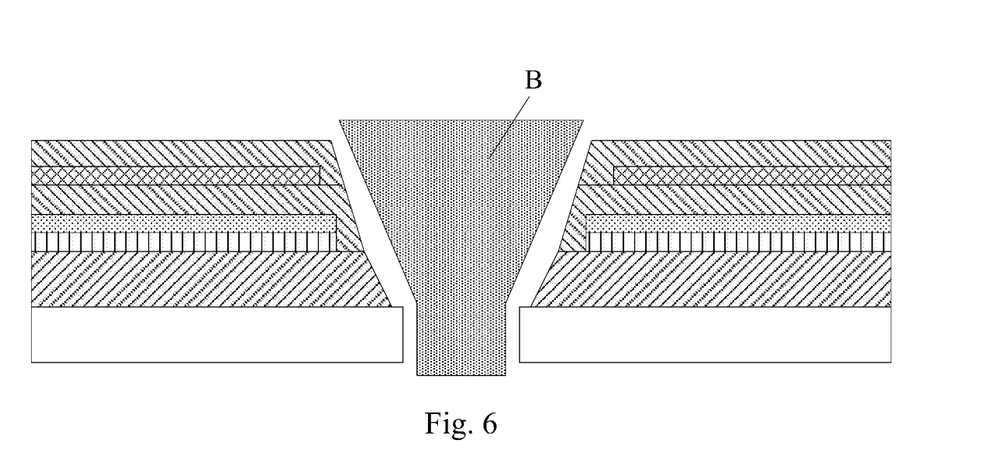
FIG. 6 is a schematic structural diagram of a display device according to an embodiment of this disclosure.

Specifically in the display device above according to the embodiment of this disclosure, as illustrated in FIG. 6, the component B such as a front camera, an earphone, a fingerprint recognizing element, or a physical button and so on can be arranged in the via-hole of the flexible display panel.

In the flexible display panel, the method for fabricating the same, and the display device above according to the embodiments of this disclosure, the protruding structure is formed in the via-hole area on the flexible base substrate so that both the protruding structure, and the portions of the organic light-emitting functional film and the top electrode layer covering the protruding structure can be removed instead of arranging a suspended component for shielding the via-hole area, in a vapor-plating mask, so that there are no patterns of the organic light-emitting functional film and the top electrode layer in the via-hole area. Thereafter the encapsulation thin film covering the patterns of the organic light-emitting functional film and the top electrode layer is formed to encapsulate the organic light-emitting functional film in the via-hole area to thereby seal the flexible display panel in the via-hole area so as to prevent display elements from failing. After the encapsulation thin film is formed, the step of removing the pattern of the encapsulation thin film in the via-hole area can be further performed to expose the flexible base substrate in the via-hole area, and after the flexible base substrate in the via-hole area is removed, a via-hole can be formed in the flexible base substrate.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A method for fabricating a flexible display panel, comprising:
   forming a protruding structure in a via-hole area on a flexible base substrate, wherein the via-hole area is in a display area of the flexible base substrate;
   forming an organic light-emitting functional film and a top electrode layer successively on the flexible base substrate formed with the protruding structure;
   removing the protruding structure and portions of the organic light-emitting functional film and the top electrode layer covering the protruding structure, to form patterns of the organic light-emitting functional film and the top electrode layer;
   forming an encapsulation thin film covering the patterns of the organic light-emitting functional film and the top electrode layer on the flexible base substrate;
   removing a portion of the encapsulation thin film in the via-hole area; and
   removing a portion of the flexible base substrate in the via-hole area.

2. The method according to claim 1, wherein an area of a cross section of the protruding structure increases gradually along a direction from the flexible base substrate pointing to away from the flexible base substrate, the cross section being parallel to the flexible base substrate.

3. The method according to claim 1, wherein the forming the protruding structure in the via-hole area on the flexible base substrate comprises:
   forming a negative photo-resist layer on the flexible base substrate; and
   patterning the negative photo-resist layer to form the protruding structure.

4. The method according to claim 1, wherein the removing the protruding structure and the portions of the organic light-emitting functional film and the top electrode layer covering the protruding structure, to form the patterns of the organic light-emitting functional film and the top electrode layer comprises:
   stripping away the protruding structure using stripping liquid, and also removing the portions of the organic light-emitting functional film and the top electrode layer covering the protruding structure, to form the patterns of the organic light-emitting functional film and the top electrode layer.

5. The method according to claim 1, wherein forming the encapsulating thin film comprises:
   forming a plurality of layers of inorganic thin films and at least one layer of organic thin film, the plurality of layers of inorganic thin films and the at least one layer of organic thin film being arranged alternately; and
   forming the organic thin film in the encapsulation thin film comprises:
   forming the organic thin film in the other area than the via-hole area through inkjet printing.

6. The method according to claim 5, wherein the forming the organic thin film in the other area than the via-hole area through inkjet printing comprises:
   forming a pattern of the organic thin film, which is the same as the patterns of the organic light-emitting functional film and the top electrode layer, through inkjet printing.

7. The method according to claim 1, wherein the removing the portion of the flexible base substrate in the via-hole area comprises:
   removing the portion of the flexible base substrate in the via-hole area using laser.

8. The method according to claim 1, wherein before forming the protruding structure in the via-hole area on the flexible base substrate, the method further comprises:
   forming a pixel circuit structure layer on the flexible base substrate, wherein the pixel circuit structure layer has a hollow area in the via-hole area.

9. The method according to claim 1, wherein forming the organic light-emitting functional film comprises:

forming a hole injection layer, an electron blocking layer, an organic light-emitting layer, a hole blocking layer, and an electron injection layer.

\* \* \* \* \*